Figure 1:
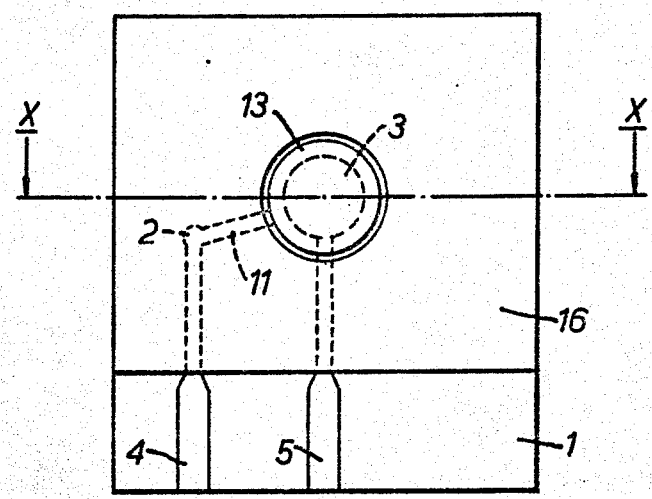

United States Patent [19]

Quilliam et al.

[11] 4,158,117
[45] Jun. 12, 1979

[54] PRESSURE SENSITIVE SWITCH

[75] Inventors: Robert M. Quilliam, Chelmsford; Howitt R. Gallantree, Maldon; Andrew J. Watt, Grays, all of England

[73] Assignee: The Marconi Company Limited, Chelmsford, England

[21] Appl. No.: 849,609

[22] Filed: Nov. 8, 1977

[30] Foreign Application Priority Data

Dec. 2, 1976 [GB] United Kingdom ............... 50204/76

[51] Int. Cl.² ...................... H01H 57/00; H01H 1/02; H02K 1/22; G08C 1/00
[52] U.S. Cl. ............................... 200/181; 340/365 A; 310/329; 200/262
[58] Field of Search ............... 200/181, 159 R, 159 B, 200/262, 269, 83 R, 83 A, 83 B, 83 J, 83 Y, 83 Z; 310/311, 319, 326, 328, 329, 333, 345, 348; 340/365 A

[56] References Cited

U.S. PATENT DOCUMENTS

| 3,120,583 | 2/1964 | Cornell | 340/365 A |
|---|---|---|---|
| 3,464,531 | 9/1969 | Herr et al. | 340/365 A |
| 3,503,031 | 3/1970 | Nyhus et al. | 340/365 A |
| 3,586,889 | 6/1971 | Kolter | 310/329 |
| 3,935,485 | 1/1976 | Yoshida et al. | 200/181 X |
| 3,940,637 | 2/1976 | Ohigashi et al. | 200/181 X |

*Primary Examiner*—William Price
*Assistant Examiner*—Steven M. Pollard
*Attorney, Agent, or Firm*—Diller, Ramik & Wight

[57] ABSTRACT

A pressure sensitive switch including a poly (vinylidene fluoride) (PVF$_2$) sheet arranged to be compressed and laterally outwardly distended under a load carrying on each major surface thereof contact means for receiving a signal generated by the sheet when compressed and distended two thick blocks of solid elastomeric material between which is sandwiched the sheet, and means for compressing and laterally outwardly distending both blocks by relative motion toward each other thereby in the absence of tension forces compressing and laterally outwardly distending the sheet sandwiched therebetween to generate the signal.

6 Claims, 2 Drawing Figures

PRESSURE SENSITIVE SWITCH

This invention relates to a pressure sensitive switch.

It is known to incorporate a poly(vinylidene fluoride) (PVF$_2$) sheet which has been polarised to render it piezo-electric in a pressure sensitive switch and one such known switch is formed by the sequential connection of a foamed elastomer sheet, an electrical contact, a PVF$_2$ sheet, a further electrical contact, a further foamed elastomer sheet and a manual push button. Operation of the push button by depression compresses the foamed elastomer sheets, which in turn compress the PVF$_2$ sheet. As is known with polarised PVF$_2$ material, when the material is compressed it generates an electrical signal and so when the PVF$_2$ sheet is compressed a signal is generated across the electrical contacts of the order of 100 pico-coulombs/Newton. However, such a known switch tends to suffer from the disadvantage that the foamed elastomer sheet, when compressed by the operation of the push button, abrasively acts upon the electrical contacts thereby producing wear of the contacts.

The present invention seeks to provide a pressure sensitive switch in which the foregoing disadvantage is at least partially mitigated and in which the generated signal output from the PVF$_2$ sheet is increased.

According to this invention, a pressure sensitive switch includes a poly(vinylidene fluoride) (PVF$_2$) sheet arranged to be distorted under a load, contact means conductively connected to each major surface of the PVF$_2$ sheet for receiving a signal generated by the said sheet when distorted by the load, and, adjacent at least one major surface of said sheet, means for receiving the load which said means is arranged to laterally distend the PVF$_2$ sheet when subjected to said load. Although the PVF$_2$ sheet will inherently be compressed when subjected to the load, it is believed that the increased generated signal produced by a switch in accordance with this invention as achieved by the act of laterally distending the PVF$_2$ sheet.

Preferably, the means for receiving the load is mounted adjacent both major sides of the said sheet, and advantageously, is comprised by an electrically conductive solid rubber member.

In a currently preferred embodiment there is provided the sequential connection of one of said contact means, one of said electrically conductive solid rubber members, the PVF$_2$ sheet, another of said electrically conductive solid rubber members, the other of said contact means, and a manual push button for applying said load to distort the PVF$_2$ sheet and, interposed between the push button and the other of said contact means, means for pre-loading the PVF$_2$ sheet by the push button to ensure good mechanical contact therebetween.

Conveniently, the means for pre-loading is a foamed elastomer.

Figure 2:
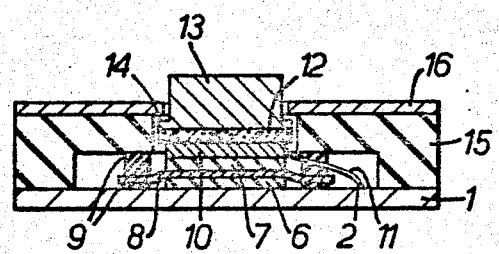

The invention will now be described, by way of example, with reference to the accompany drawings in which, FIG. 1 shows a plan view of a pressure sensitive switch in accordance with this invention, and FIG. 2 shows a section along arrow headed lines X—X of FIG. 1.

In the Figures like numbers denote like parts.

The pressure sensitive switch, shown in the FIGS. 1 and 2, has a rectangular base formed from a printed circuit board 1 upon which are etched, by known photolithographic techniques, two contact pads 2, 3 having connecting finger portions 4, 5 respectively, extending towards a major edge of the printed circuit board 1. Mounted so as to cover the contact 3 is a circular, electrically conductive, solid rubber member 6, such as the conductive elastomeric sheet material manufactured by Chomerics. Covering the rubber member 6, and sandwiched between the member 6 and a similar electrically conductive solid rubber member 7 is a sheet 8 formed from PVF$_2$ material which has been polarised so as to render it piezo-electric. The polarisation of PVF$_2$ is, as known, performed by the application of an electric field of about 3Kv at temperatures in the region of 100° C. for thirty minutes and the electric field is maintained whilst the temperature is reduced to ambient. Insulating strip members 9 are spaced on both major sides around the periphery of the sheet 8 and serve to sandwich the sheet 8 so that it is held in a flat position.

A further electrical contact 10, provided by a metal disc, is mounted on top (as viewed in FIG. 2) of the solid rubber member 7 and a wire link 11 connects the contact 10 to the contact 2. Mounted upon the contact 10 and spaced therefrom by a foamed elastomer disc 12 is a circular sectioned, manual, push bottom 13 having a radially extending flange 14 extending around the lower perimeter thereof in contact with the foamed elastomer 12. The purpose of the foamed elastomer 12 is to pre-load the push button 13 into good mechanical contact with the metal disc contact 10 and apply light pressure to the PVF$_2$ sheet 8. A rectangular insulating spacer block 15 having a narrow dimension less than that of the printed circuit board 1 to allow access to the finger portions 4, 5 to which external leads may be soldered, is provided with a circular aperture through which the flange 14 of the push button, the foamed elastomer 12, and the metal disc contact 10 extend and with a larger diameter recess to permit a passage-way for the wire link 11. Mounted on top of the spacer block 15 and so as to be in alignment with the periphery of the block 15 is a cover plate 16 having a circular aperture dimensioned to permit the push button 13 to extend therethrough but of smaller diameter than the flange 12 such that the combination of the aperture in the cover plate 16 and the flange 14 presses the push button 13 into the aforementioned pre-loading relationship with the foamed elastomer 12.

In operation, depression of the manual push button 13 compresses the foamed elastomer 12 and further depression of the button 13 causes the metal disc 10 to squeeze the sandwiched combination of the solid rubber members 6, 7 and the PVF$_2$ sheet 8. Because the rubber members 6, 7 are formed from solid rubber, they not only compress but also expand laterally with the effect that the PVF$_2$ sheet is also not only compressed but also laterally distended. The mechanical gain effected by the solid rubber members 6, 7 in not only compressing the sheet 8, but also distending it, has been found to provide an output response from the PVF$_2$ sheet 8 of 500 pico-coulombs/newton compared with the 100 pico-coulombs/newton for the prior art switch constructed by the applicants in which the foamed elastomer sheet was capable of providing only a compression force. With the switch of the present invention, a potential of 10 volts has been produced at the portions 4, 5 into a high input impedance amplifier.

We claim:

1. A pressure sensitive switch comprising a poly (vinylidene fluoride) ($PVF_2$) sheet arranged to be compressed and laterally outwardly distended under a load, contact means conductively connected to each major surface of said sheet for receiving a signal generated by said sheet when compressed and distended by the load, two thick blocks of solid elastomeric material between which is sandwiched said sheet, and means for compressing and laterally outwardly distending both blocks by relative motion toward each other and also in the absence of tension forces compressing and laterally outwardly distending said sheet sandwiched therebetween to generate said signal.

2. The pressure sensative switch as defined in claim 1 wherein at least one of said two thick blocks is electrically conductive.

3. The pressure sensitive switch as defined in claim 1 wherein said two thick blocks are each electrically conductive, and there is provided the sequential connection of one of said contact means, one of said electrically conductive thick blocks, the $PVF_2$ sheet, the other of said two electrically conductive thick blocks, the other of said contact means, and said compressing means, said compressing means being a manual push button for applying said load to compress and distend said blocks and sheet, and means interposed between said push button and the other of said contact means for preloading said sheet.

4. The pressure sensative switch as defined in claim 3 wherein said preloading means is a foamed elastomer.

5. A pressure sensitive switch comprising a poly (vinylidene fluoride) ($PVF_2$) sheet arranged to be compressed and laterally outwardly distended under a load, contact means connected to each major surface of said sheet for receiving a signal generated by said sheet when compressed and distended by the load, two thick blocks of solid elastomeric material between which is sandwiched said sheet, an electrical contact adjacent one of said thick blocks, means for preloading said sheet through said contact, means for compressing and laterally outwardly distending both blocks by relative motion toward each other and also in the absence of tension forces comprising and laterally outwardly distending said sheet sandwiched therebetween to generate said signal, and said preloading means being sandwiched between said one thick block and said compressing means.

6. The pressure sensitive switch as defined in claim 5 wherein said preloading means is a foamed elastomer.

* * * * *